United States Patent
Turner (10) Patent No.: US 7,565,392 B2
(45) Date of Patent: Jul. 21, 2009

(54) SINGLE-LEVEL PARALLEL-GATED CARRY/MAJORITY CIRCUITS AND SYSTEMS THEREFROM

(75) Inventor: Steven Turner, Westbrook, ME (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 313 days.

(21) Appl. No.: 10/593,807

(22) PCT Filed: Jul. 6, 2005

(86) PCT No.: PCT/US2005/024010

§ 371 (c)(1),
(2), (4) Date: Sep. 21, 2006

(87) PCT Pub. No.: WO2006/012362

PCT Pub. Date: Feb. 2, 2006

(65) Prior Publication Data

US 2007/0208797 A1      Sep. 6, 2007

Related U.S. Application Data

(60) Provisional application No. 60/585,632, filed on Jul. 6, 2004, provisional application No. 60/585,719, filed on Jul. 6, 2004.

(51) Int. Cl.
*G06F 7/50* (2006.01)
(52) U.S. Cl. ....................................... 708/701
(58) Field of Classification Search ................. 708/701, 708/702
See application file for complete search history.

(56) References Cited

U.S. PATENT DOCUMENTS

| | | | |
|---|---|---|---|
| 3,248,529 A | | 4/1966 | Buelow et al. |
| 3,560,886 A | * | 2/1971 | Haines ....................... 330/254 |
| 4,599,572 A | * | 7/1986 | Nakayama .................... 330/69 |
| 4,617,475 A | * | 10/1986 | Reinschmidt ................. 326/11 |
| 4,740,907 A | * | 4/1988 | Shimizu et al. ............. 708/701 |
| 5,577,199 A | | 11/1996 | Tanabe et al. |
| 5,774,082 A | * | 6/1998 | Chu et al. .................... 341/117 |
| 6,008,670 A | | 12/1999 | Pace et al. |
| 6,262,604 B1 | | 7/2001 | Gabet et al. |
| 6,285,262 B1 | * | 9/2001 | Kuriyama ..................... 331/25 |
| 6,347,325 B1 | | 2/2002 | Ribner et al. |
| 6,366,174 B1 | | 4/2002 | Berry et al. |
| 6,420,932 B1 | * | 7/2002 | Casper ........................ 330/258 |

(Continued)

OTHER PUBLICATIONS

Turner, et al., Benchmark Results For High-Speed 4-Bit Accumulators Implemented In Indium Phosphide DHBT Technology, IEEE Lester Eastman Conference on High Performance Devices, Rensselaer Polytechnic Institute, Aug. 4-6, 2004.

(Continued)

*Primary Examiner*—Tan V Mai
(74) *Attorney, Agent, or Firm*—Daniel J. Long; Vernon C. Maine; Vern Maine & Associates (57) ABSTRACT

A carry/majority circuit, comprising a plurality of differential transistor pairs coupled in parallel and forming a pair of output nodes, with a single parallel gated level. Current is steered through a leg of the transistor pair having a higher input voltage.

7 Claims, 8 Drawing Sheets

U.S. PATENT DOCUMENTS

| | | | |
|---|---|---|---|
| 6,545,502 B1* | 4/2003 | Dasgupta et al. | 326/21 |
| 6,704,761 B1 | 3/2004 | Farrokh et al. | |
| 2002/0198912 A1 | 12/2002 | Humphreys et al. | |

OTHER PUBLICATIONS

Gutierrez-Aitken, et al., Ultrahigh-Speed Direct Digital Synthesizer Using InP DHBT Technology, IEEE Journal of Solid-State Circuits, vol. 37, No. 9, Sep. 2002, pp. 1115-1119.

He, et al., Self-Aligned InP DHBT With $f_t$ and $f_{max}$ Over 300 GHz in a New Manufacturable Technology, IEEE Electron Device Letters, vol. 25, No. 8, Aug. 2004, pp. 520-522.

Ekroot, et al., A GaAs 4-bit Adder-Accumulator Circuit for Direct Digital Synthesis, IEEE Journal of Solid-State Circuits, vol. 23, No. 2, Apr. 1988, pp. 573-580.

Turner, et al., 4-Bit Adder-Accumulator at 41-GHz Clock Frequency in InP DHBT Technology, IEEE Microwave and Wireless Components Letters, 2005, pp. 1-3.

Mathew, et al., 2-Bit Adder Carry and Sum Logic Circuits Clocking at 19 GHz Clock Frequency in Transferred Substrate HBT Technology, Dept of Electrical and Computer Engineering, University of California, Santa Barbara, CA 93106, GTRAN Inc, Newbury Park, CA 91320.

Dvorak, et al., 300 GHz InP/GaAsSb/InP Double HBTs with High Current Capability and $BV_{CEO} \geq 6V$, IEEE Electron Device Letters, vol. 22, No. 8, Aug. 2001, pp. 361-363.

Salous, et al., FPGA-based Hybrid Accumulator Architecture for Digital Chirp Synthesis, Int. J. Electronics, 1996, vol. 80, No. 3, pp. 441-447.

Betowski, et al., Considerations for Phase Accumulator Design for Direct Digital Frequency Synthesizers, School of Electrical Engineering & Computer Science, Washington State University, Pullman, WA 99164.

Mathew, et al., 2-Bit adder: Carry and Sum Logic Circuits at 19 GHz clock frequency in InAlAs/InGaAs HBT Technology, Electronics Letters, vol. 37, No. 19, Sep. 13, 2001, pp. 1156-1157.

* cited by examiner

SINGLE-LEVEL PARALLEL-GATED CARRY/MAJORITY CIRCUITS AND SYSTEMS THEREFROM

RELATED APPLICATIONS

This application claims the benefit of U.S. Provisional Applications No. 60/585,719, filed Jul. 6, 2004, and 60/585,632 filed Jul. 6, 2004. Each is incorporated in its entirety by reference.

STATEMENT OF GOVERNMENT INTEREST

Portions of the present invention may have been made in conjunction with Government funding under contract DAAD17-02-C-0115, and there may be certain rights to the Government.

FIELD OF THE INVENTION

The present invention relates generally to the processing of numerical data and more particularly to circuit designs for arithmetic processing.

BACKGROUND OF THE INVENTION

Underlying advanced digital processing systems are smaller basic digital circuit building blocks. The simple building blocks are combined and arranged in such a manner as to provide extremely fast and sophisticated processing.

A carry circuit is typically used in arithmetic units, such as adder or subtractors, to process a carry operation in order to transfer a carry signal to the following carry operation. The carry circuits can be arranged to form other devices such as accumulators which can be further expanded to such devices as direct digital synthesizers (DDS).

Existing accumulator architectures include a 4 bit adder accumulator using 2 bit adder blocks generally described in C. G. Eckroot and S. I. Long, "A GaAs 4-bit adder-accumulator circuit for direct digital synthesis," *IEEE Journal of Solid State Circuits*, vol. 23, no. 2, pp. 573-580, April 1988. The Eckroot and Long design details a circuit consisting of adder, register and lookahead-carry logic.

The system uses 2-bit adder blocks which are cascadable to any 2N-bit width and forms the basis for the pipelined accumulator, wherein this is particularly useful in applications where larger bit width permits greater output resolution. The pipelined structure of the adder-accumulator allows for the expansion to wider data words while preserving high clock frequency operation.

In order to alleviate the 'slowest' part of the adder-accumulator designs, the cascaded architecture allows for wide bit-width accumulators without much of a speed penalty, since the frequency of operation is determined by the feedback of the sum and the setup time of the carry input. As the bit-width increases, the total number of accumulators increases linearly, while the total number of registers increases in a quadratic fashion:

$$\# \text{accumulators} = \frac{\text{bits}}{2}$$

$$\# \text{registers} = \frac{\text{bits}^2}{8} - \frac{\text{bits}}{4}$$

This existing logic circuit is a traditional 4-bit adder with carry and propagates carry outputs. The interconnection of the 4-bit adders provides complete lookahead carry logic by partial coupling of the 2-bit registers. The power consumption of the registers becomes a dominant factor for accumulators with large bit-widths, thus limiting commercial applications that demand lower power implementations.

In the general pipelined adder-accumulators, the circuits were complex because numerous latches were required for synchronization between stages. For adder-accumulators of 8 to 10 bits total resolution, a pipelined architecture using 2-bit adder blocks seemed to provide a reasonable compromise between circuit complexity and clock speed, with the disadvantages noted herein. Among the noted aspects of the standard design, the gate propagation delays largely determined the maximum clock frequency. For example, the gate delay for the carry logic circuit using standard two-level series-gated ECL logic requires two cascaded gates. Numerous attempts have been made to increase the processing speed in a commercially viable manner.

One improvement to the typical design individual 2-bit adder blocks which contains internal pipelining and an architecture that merges the logic and latching functions is described by T. Mathew, S. Jaganathan, D. Scott, S. Krishnan, Y. Wei, M. Urtega, M. Rodwell, and S. Long, "2-bit Adder Carry and Sum Logic Circuits Clocking at 19 GHz Clock Frequency in Transferred Substrate HBT Technology," in *Proceedings of IEEE International Conference on Indium Phosphide and Related Materials*, Nara, Japan, May 2001, pp. 505-508, and T. Mathew, S. Jaganathan, D. Scott, S. Krishnan, Y. Wei, M. Urtega, M. J. W. Rodwell, and S. Long, "2-bit adder: carry and sum logic circuits at 19 GHz clock frequency in InAlAs/InGaAs HBT technology," *Electronics Letters*, vol. 37, no. 19, pp. 1156-1157, September. 2001. This system was designed to increase the clock rate of the carry and sum logic circuit of a 2-bit adder.

For this 2-bit adder block, the carry blocks and sum blocks contain both logic functionality and latches, thus the clock inputs $\Phi_1$ and $\Phi_2$ control these internal latches. The left and right sides of the adder are driven by opposite clock phases, $\Phi_1$ and $\Phi_2$, resulting in the computation and latching of a full 2-bit add operation in a single clock cycle.

The modular 2-bit adder forms the basis for the pipelined accumulator. While a 4-bit accumulator is demonstrated, the 2-bit adder can be cascaded to an arbitrary 2N-bit width. This makes the adder-accumulator particularly useful in applications where the larger bit width allows for greater output resolution, such as direct digital synthesizer (DDS) applications. Additionally, the pipelined structure of the adder-accumulator allows for the expansion to wider data words while preserving high clock frequency operation.

As noted in the adder circuit, the 2-bit sum and carry operations are as follows wherein $A_0$ and $B_0$ are the 2 adder inputs; $C_0$ is the carry input to the full adder; $S_0$ is the sum logic:

$$C_1 = A_0 \cdot B_0 + A_0 \cdot C_0 + B_0 \cdot C_0$$

$$C_2 = A_1 \cdot B_1 + A_1 \cdot C + B_1 \cdot C$$

$$S_0 = A_0 \oplus B_0 \oplus C_0$$

$$S_1 = A_1 \oplus B_1 \oplus C_1$$

In order to reduce delays for the carry logic circuit using standard two-level series-gated ECL logic, which requires two cascaded gates, the AND-OR logic was realized as a single three-level series-gated ECL gate. This reduced the gate delay and somewhat improved overall performance. The clock frequency was further increased by merging the logic evaluation and latching (synchronization) resulting in a four-level series-gated structure. The Carry 1 and Sum 0 are computed on one clock phase. Carry 2 and Sum 1 are computed on the other clock phase. The full 2-bit adder is computed in a single clock cycle. There are two latches added in the design to match data phases and the latches are half of the master/save latch.

While generally useful, the carry and sum circuits typically require four series-gated levels, while registers only require two series-gated levels. Unless multiple power supplies are utilized, the extra levels translate into unnecessary power consumption in the registers. The problems associated with having multiple power supplies for the design with carry and sum circuits both requiring four series-gated levels, while registers only requiring two series-gated levels was heretofore unresolved.

The processing of numerical data is typically carried out in a digital computer and consists of numerous schemas. One example involves frequency synthesizers. The general requirements for frequency generation are to provide precise frequency control and fast response, therefore the underlying circuit design must allow for high speed efficient processing, as even minor improvements reducing the processing time for a given operation can equate to significant improvements when dealing with large number crunching operations.

While carry/majority circuits are generally known, there are also known limitations with respect to speed and power requirements. What is needed, therefore, are designs and systems for improved carry/majority circuit for applications such as high speed accumulators that will provide very fast processing. Such a system should also have low power requirements and preferably utilize fabrication techniques known in the industry and be readily integrated into higher assemblies.

SUMMARY OF THE INVENTION

One embodiment of the present invention is a carry/majority circuit design including a single parallel gated level scheme of the carry/majority circuit that has a lower propagation delay and allows for higher clock rates. Depending upon the number/layout of transistor pairs, the circuit can be a carry circuit or majority circuit.

According to one embodiment, all of the inputs of the carry circuit are on the same level allowing a lower propagation delay and higher clock rates in high speed accumulators.

A further embodiment of the invention is a circuit design that includes the n-way majority function which takes n input bits, and outputs '1' if at least half of the inputs are '1', otherwise it outputs '0'. Carry/majority circuits are used in many different applications and systems such as digital logic systems, adders, accumulators and direct digital synthesizers (DDS).

In one embodiment, the present design is a 4-bit adder-accumulator but instead of using multi-level series-gated logic for the carry circuit, the present design uses a single-level parallel-gated logic. One of the single-level parallel-gated logic designs operates at 41 GHz clock frequency in InP DHBT technology. In one embodiment, additional diodes are added to the carry circuit to preserve logic level compatibility with other circuits in a chip implementation with a single power supply. A further design enables operation at a supply voltage at 3.6V.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTIONS

Figure 1:
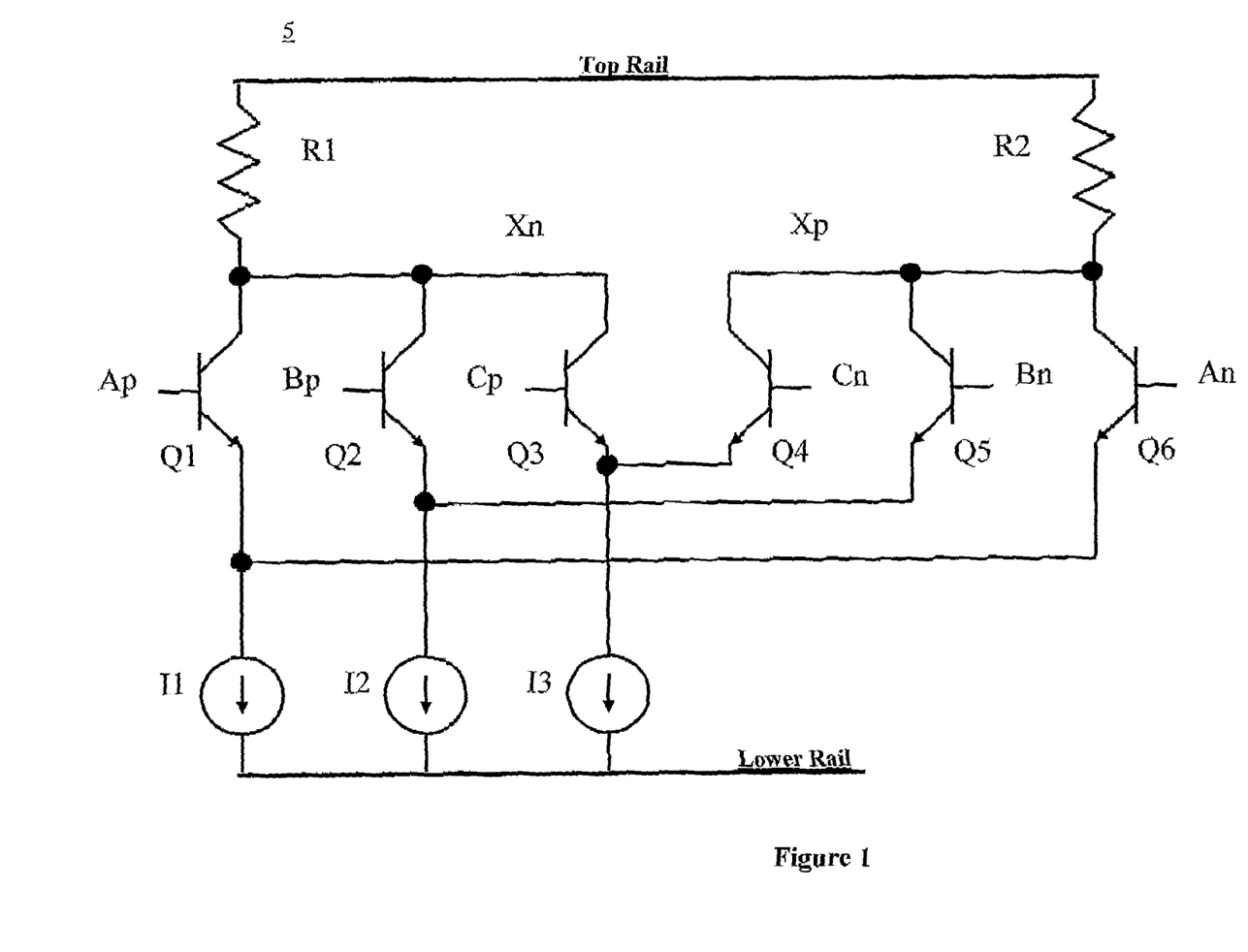
FIG. 1 shows a majority circuit with three inputs configured in accordance with one embodiment of the present invention.

The circuit of FIG. 1 is a carry/majority circuit 5 that detects when two or three of the inputs are high. The circuit in this embodiment relies on differential emitter coupled logic (ECL) and it has three identical differential pairs, however the implementation in ECL is not a limitation as other technologies can be employed. The differential pair inputs in this example have inputs illustrated as Ap/An, Bp/Bn, and Cp/Cn. These differential pair inputs are respectively coupled to differential pairs Q1/Q6; Q2/Q5; and Q3/Q6. The present system steers current through the leg of the circuit with the higher differential, wherein the current through the leg is represented as I1, I2 and I3 respectively for each differential pair. For each differential pair, the current is steered through the transistor with the higher input voltage.

There is a Top Rail coupled to the other end of the resistors R1/R2 that may be coupled to ground or a voltage supply depending upon the design. Likewise, the Lower Rail is coupled to the legs of the differential transistor pairs and can be coupled to a power supply or ground depending upon the particulars. For the illustrated circuit 5, if the Top Rail is coupled to ground, the Lower Rail is coupled to a negative supply. If the Top Rail is coupled to a positive supply, the Lower Rail is coupled to ground.

Thus, if one of the differential inputs is a logical 'High', all of the current from the corresponding differential pair flows through R1, and the voltage of node Xn would be reduced by an amount equal to R1 times the differential pair current I1, I2 or I3. Since the three differential transistor pairs, Q1/Q6; Q2/Q5; and Q3/Q6, are connected in parallel to R1 and R2, the node output Xp/Xn is the result of the sum of the currents times the resistors. Thus if none of the inputs are 'High', then no current goes thorough R1, and the node Xn has a voltage equal to the top supply rail, all of the current goes through R2, and node Xp has a voltage equal to the top supply rail minus three times the differential pair current times R2. This results in a situation where the voltage at node Xp is less than Xn and the output is a logical 'Low'.

If only one of the inputs is high, then one of the differential currents goes thorough R1, and the node Xn has a voltage equal to the top supply rail minus the differential current times R1. Two of the three differential currents go through R2, and node Xp has a voltage equal to the top supply rail minus two times the differential pair current times R2. This results in a situation where the voltage at node Xp is less than Xn and the output is a logical 'Low'.

If only two of the inputs are high then two of the differential currents go thorough R1, and the node Xn has a voltage equal to the top supply rail minus two times the differential current times R1. One of the three differential currents goes through R2, and node Xp has a voltage equal to the top supply rail minus the differential pair current times R2. This results in a situation where the voltage at node Xp is greater than Xn and the output is a logical 'High'.

The carry/majority circuit is shown as a differential input circuit, but it could also be implemented as a single-ended input circuit if reference voltages are used for one side of each input. In general, this is done by tying the "n" inputs to a voltage reference midway between the logic voltage swing, and using only the "p" inputs for data inputs. Such configurations are well known to those skilled in the art.

If three of the inputs are high then all three of the differential currents go thorough R1, and the node Xn has a voltage equal to the top supply rail minus three times the differential current times R1. None of the three differential currents goes through R2, and node Xp has a voltage equal to the top supply rail. This results in a situation where the voltage at node Np is greater than Xn and the output is a logical 'High'. The truth table of the circuit is shown in Table A, where a "1" is a logical 'High', such as when Ap>An and a "0" is a logical 'Low', such as when Ap<An.

TABLE A

| A | B | C | X |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Figure 2:
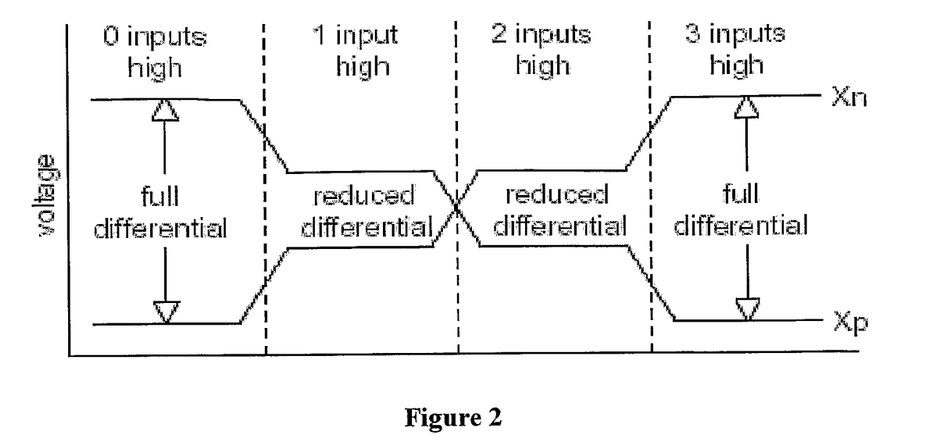
FIG. 2 is a timing diagram of the output of the majority circuit for the single-level parallel-gated carry circuit with cascaded latch configured in accordance with one embodiment of the present invention.

Referring to FIG. 2, the output of the three input carry circuit is illustrated. The output differential is displayed showing the voltage versus time with respect to the nodes Xn and Xp. With no inputs 'High', there is a full differential between Xn and Xp as shown. With either one or two inputs 'High', there is a reduced differential as illustrated. When all three of the inputs are either High or Low, a full differential is seen across Xp and Xn, since all of the current is steered through one leg of the circuit. When one or two of the inputs are High, the differential across Xp and Xn is reduced, since ⅓ of the current is streered through one leg of the circuit while ⅔ of the current is steered through the other leg of the circuit. Although this method has a reduced differential for some input states, the differential across Xp and Xn is typically sampled by a latch which generates a full differential for propagation to subsequent stages.

Figure 3:
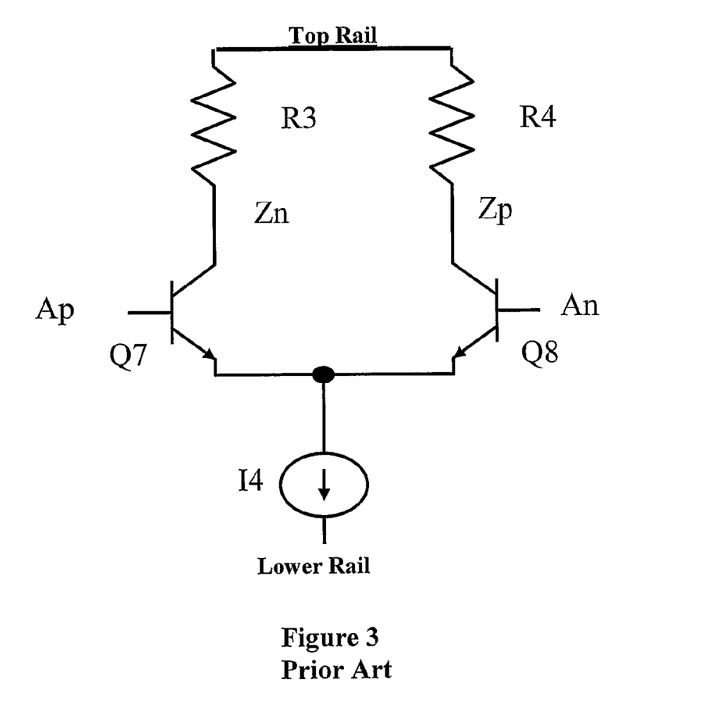
FIG. 3 illustrates a prior art buffer circuit.

The reduced differential areas can be compensated for by feeding the output Xp/Xn into a buffer or a latch circuit as shown in FIG. 3. The buffer or latch circuit is well known in the art and recovers the output to a full differential value. As noted in the prior art buffer circuit of FIG. 3, the circuit relies on current steering and essentially all of the current flows through the transistor Q7 or Q8 with the higher input voltage. A similar structure is used in FIG. 5, but with Q26/Q27, R12/R13 employing a clock control to restore the output of the single-level parallel-gated carry/majority circuit to a full differential. It is possible to implement the buffer using an emitter coupled logic buffer, or by using a clocked latch or register. Other buffer implementations can also be implemented.

Figure 4:
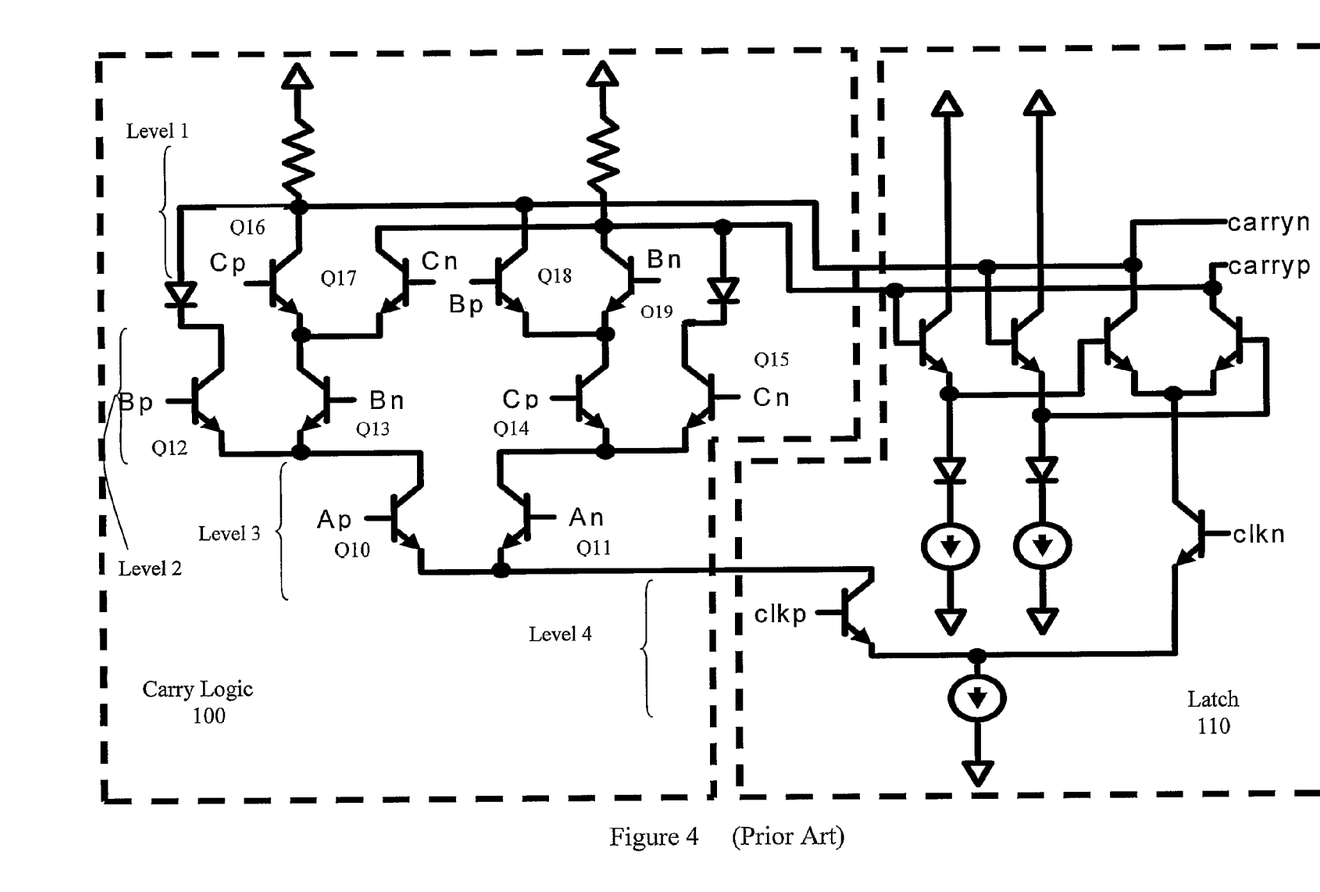
FIG. 4 shows a prior art carry circuit integrated with a latch.

A three input majority circuit is useful as a carry circuit for high speed accumulators that integrate carry logic 100 and latch 110. Referring to FIG. 4, the prior art circuit illustrates that the inputs to transistors Q10-Q19 of the carry circuit are on three different voltage levels, and the overall circuit has four series-gated levels. The lower voltage levels switch at a slower speed than the upper levels. Such a design requires a higher voltage which translates into more power in register stages. In one example, the four-series gated levels constrain the supply to 5.5V.

Figure 5:
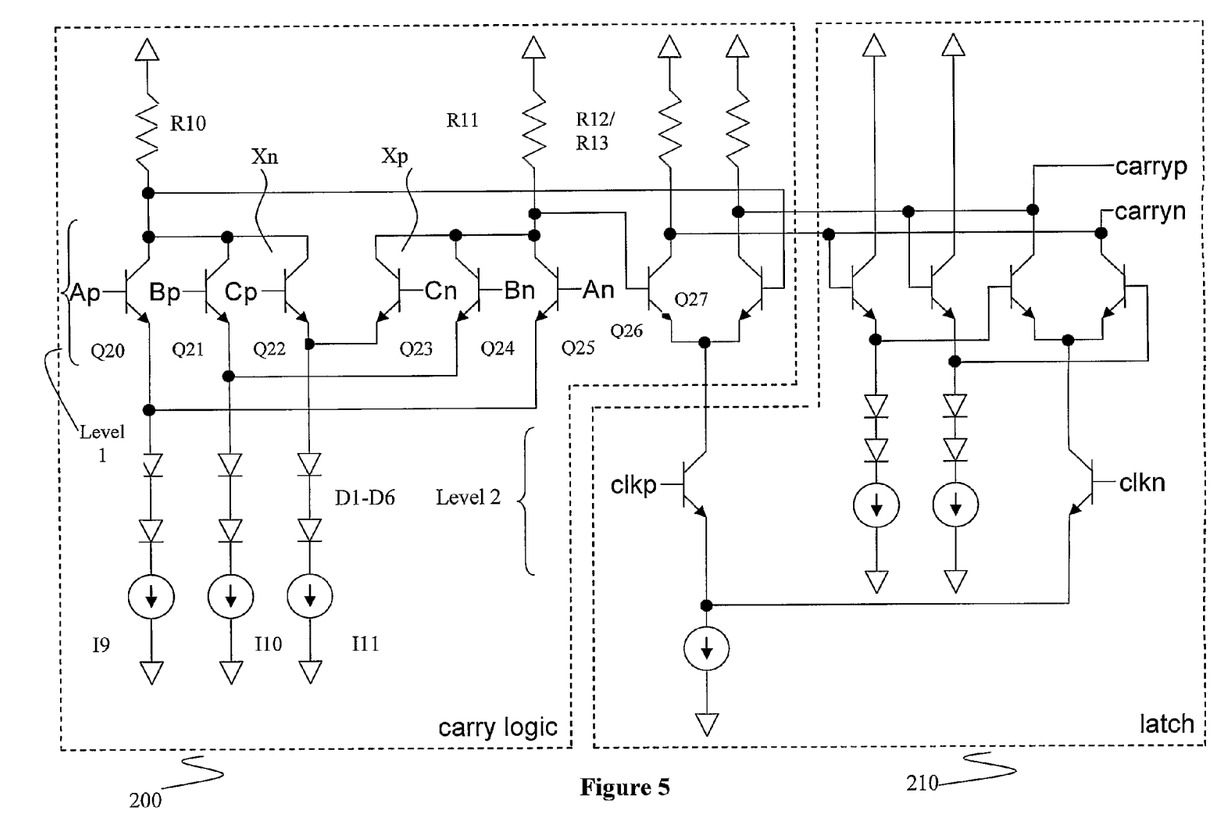
FIG. 5 is a schematic perspective showing single-level parallel-gated carry circuit configured in accordance with one embodiment of the present invention.

The accumulator with the modified carry circuit according to one embodiment is shown in FIG. 5. The circuit logic 200 is still merged with the latch 210, but the carry logic 200 is reduced to one parallel gated level and the entire circuit has two gated levels. FIG. 5 combines the carry/majority circuit of FIG. 1 with a clocked latch circuit. The addition of the latch circuit recovers the output of the carry/majority circuit to a full differential, and it provides the timing control required for most sequential logic circuits.

Referring again to FIG. 5, the single-level parallel gated logic circuit has a carry logic section 200 and a latch section 210 and the use of single-level parallel-gated logic is well suited for the carry terms since the carry operation essentially detects when two or three of the inputs are high. When all three of the inputs are either High or Low, a full differential is seen across Xp and Xn, since all of the current is steered through one leg of the circuit. When one or two of the inputs are High, the differential across Xp and Xn is reduced, since ⅓ of the current is steered through one leg of the circuit while ⅔ of the current is steered through the other leg of the circuit. Although this method has a reduced differential for some input states, the differential across Xp and Xn is sampled by the latch 210 which generates a full differential for propagation to subsequent stages.

As described herein, the present invention merges the combinational logic functions with the latch operation, furthermore, the carry terms are implemented using a single-level parallel-gated logic structure with a cascaded latch. This allows for a lower supply voltage than state of the art designs while still operating at high clock frequencies.

Figure 6:
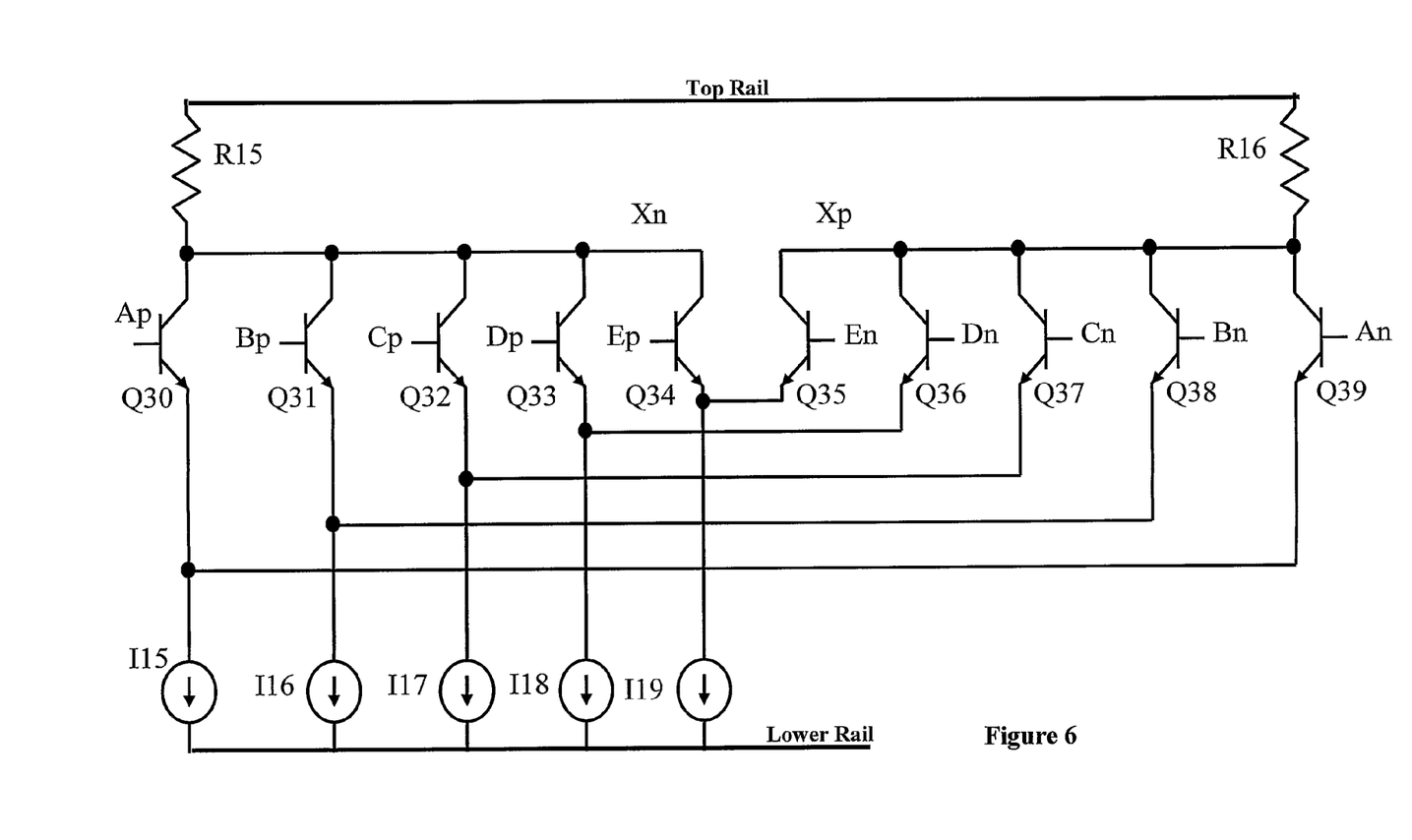
FIG. 6 is a schematic perspective drawing for a majority circuit with five inputs configured in accordance with one embodiment of the present invention.

FIG. 6 shows a five input majority circuit and is an extension of the carry circuit of FIG. 1 for more than three (3) inputs. For the extended majority circuits, the output is 'High' if more than half (or a majority) of the inputs Ap-Ep are 'High'. The single-level parallel-gated majority circuit has five differential pairs with gates Q30-Q39. This embodiment details how the single-level parallel-gated structure can be expanded to larger numbers of inputs without increasing the number of level or the voltage supply. If all of the tail currents are equal, the basic structure of the majority circuit can be expanded by adding additional differential pairs to implement a majority operation can be implemented for any odd number of inputs, such as 3, 5, 7, etc.

As shown in FIG. 6, the majority circuit uses equal tail currents I12-I16 for all of the differential pairs. It is possible for the tail currents of differential pairs in the majority circuit to be modified to give other functionality. This could be carried out for any number of differential pairs, even or odd. This extension of the basic design could yield valuable benefits depending on the desired operation, such as giving certain inputs to the majority more weight than others.

Figure 7:
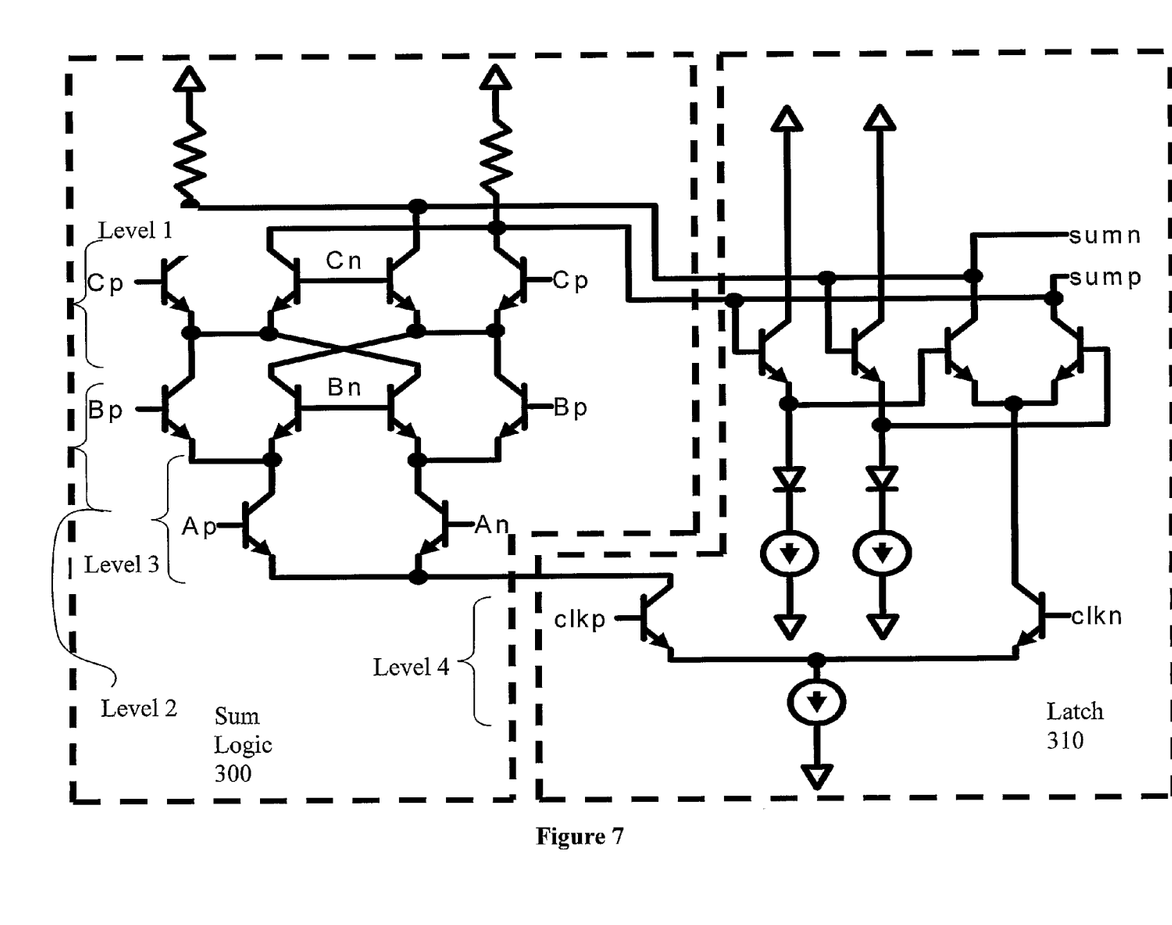
FIG. 7 is a prior art sum circuit using three input XOR structures merged with the latch and having four input levels for the sum logic section.

FIG. 7 shows the existing sum circuit design 300 merged with a latch circuit 310. This prior design employs three levels of input for the XOR structures plus one level of input for the latch, which constrains the circuit to a minimum of four levels. Since many of the components of a large digital system are registers that need only two levels, the sum circuit increases the voltage supply above what is required for the register circuit and is an inefficient use of power. There are four voltage levels in this design that result in a greater power draw. Existing carry and sum circuits are merged with latches as a basis for an accumulator architecture. While the carry and sum circuits and their respective latches are integrally processing the data, the major path is through the carry circuits in this design as long as the sum is fast enough. The carry '1' and sum '0' are computed on one clock phase while the carry '2' and sum '1' are computed on the other clock cycle. The full 2-bit add is computed in one clock cycle. There may be latches added in to match data phases.

Figure 8:
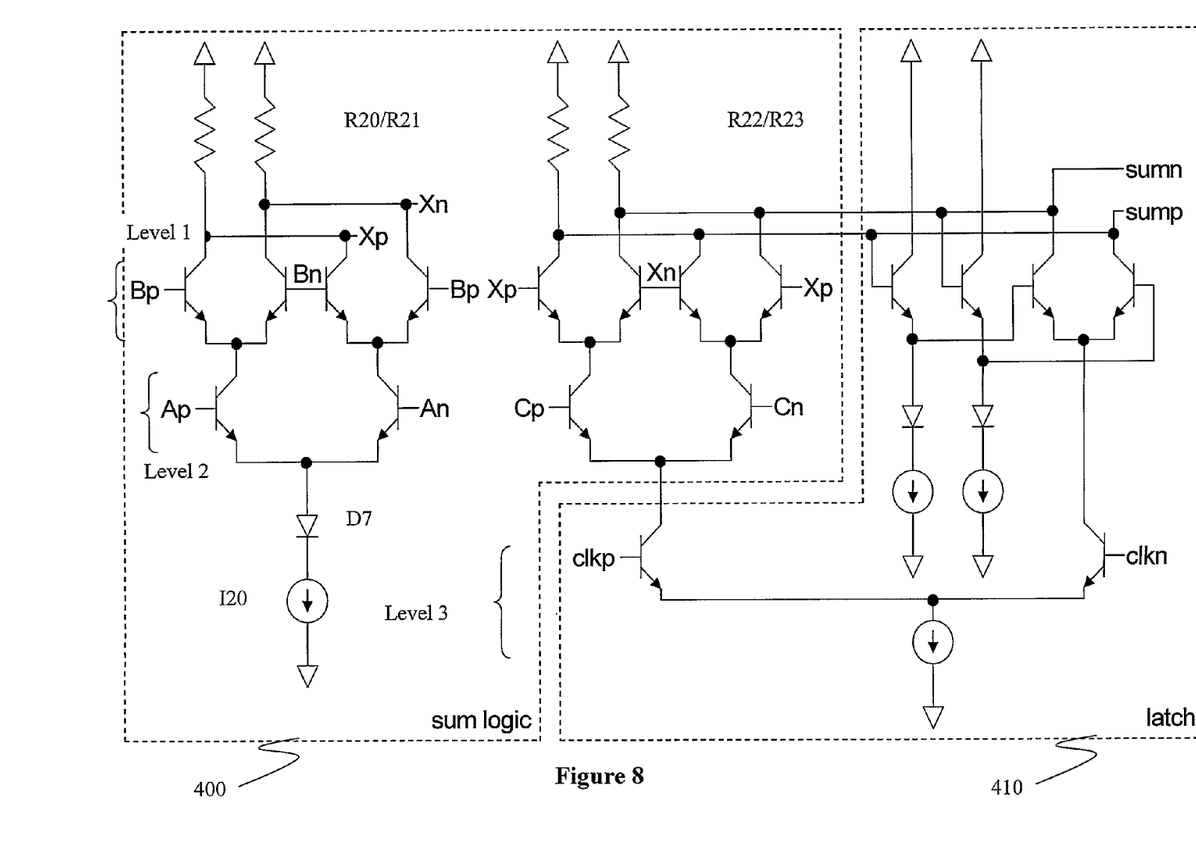
FIG. 8 is a schematic drawing showing three-level series-gated sum circuit configured in accordance with one embodiment of the present invention.

Referring to FIG. 8, another embodiment is depicted a modified sum logic 400 and latch circuit 410 reducing the power consumption. In the known sum circuit of FIG. 7 with a 4-level series gated design, the prior art sum circuit constrains the power supply from being lowered. An improvement of the present invention is an alternative sum circuit using fewer voltage levels. In one experiment, a circuit of the present design resulting in approximately 15% reduction in power.

There are two separate XOR gates and the second gate is merged with the latch circuit. This embodiment has three series-gated levels as compared to the existing design that has four levels. Since the previous sum circuit was the only portion of the circuit constraining the design to a power supply supporting four series-gated levels, the present design allows for overall power reduction. This is achieved by the removal of one diode drop from the power supply and other circuitry in the chip design. The registers in the pipeline benefit from this change in terms of power consumption, particularly in designs with large bit-widths. The inputs to the first stage are settled before the clock on the $2^{nd}$ stage is active providing lower power consumption with no degradation in speed.

Direct digital synthesizers (DDS) are one of the implementations of frequency synthesizers and are useful as a means for generating frequency-agile waveforms with complex modulation. These devices offer certain advantages over the phase locked loop (PLL) designs used in a wide array of applications in fields such as communications systems and radars.

Figure 9:
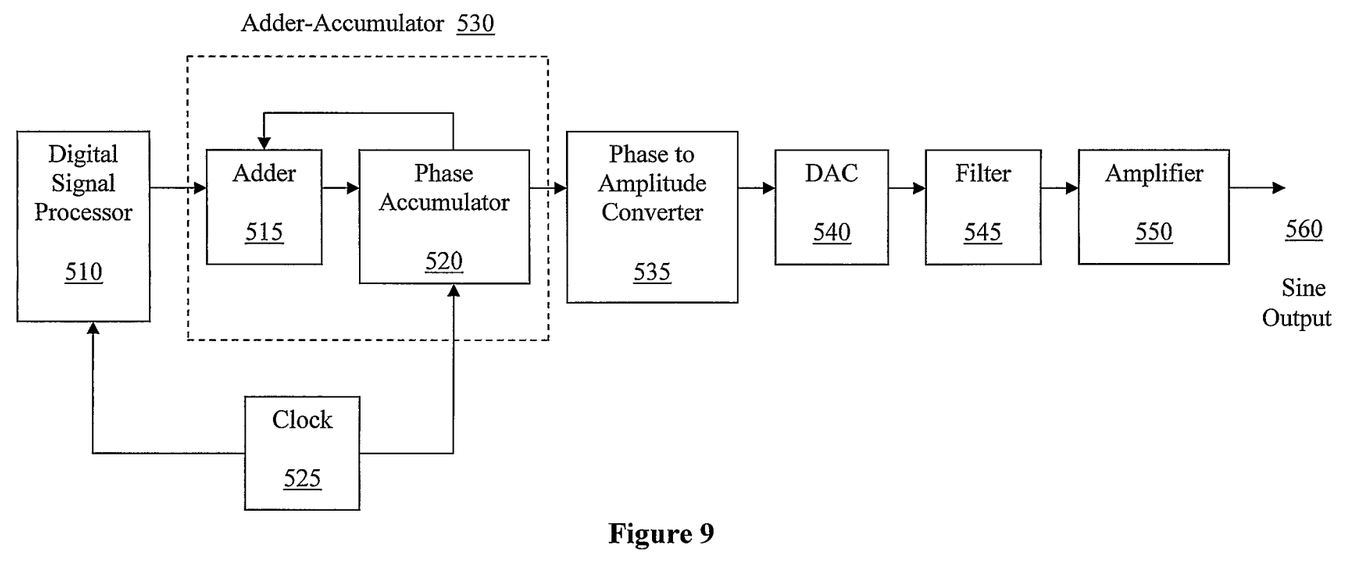
FIG. 9 is a simplified block diagram of a direct digital synthesizer (DDS) configured in accordance with one embodiment of the present invention.

Referring to FIG. 9, a simplified diagram of a DDS is shown. In general, the waveforms are stored in memory and the system steps through the memory at a fixed rate. Using many small steps equates to a lower frequency and fewer larger steps equates to a higher frequency. The DDS employs an adder-accumulator which in turn may utilize the carry circuit with the integrated latch as well as the sum logic circuit with integrated latch.

There is typically some form of a digital signal processor (DSP) 510 that generates the input word to the phase accumulator and controls the frequency of the generated sine wave 560. The DSP 510 establishes the frequency command phase increment, and sets the size of the phase steps, thereby establishing the frequency. In general, any type of data register will work, wherein the number of bits determines the frequency resolution.

The DDS typically has an adder-accumulator section 530 wherein the accumulator 520 is clocked by an oscillator 525 and adds increment from the frequency command to the previously stored value at each pulse. As noted, the input word (frequency control word) from the DSP 510 to the adder-accumulator 530 controls the frequency of the generated sine wave. The adder 515 and accumulator 520 are configured in a feedback configuration and the adder 515 generally requires a very fast N-bit adder and was typically the bottle-neck in the processing. The reference oscillator is typically at least twice as fast as the frequency of the sine output and in practicality establishes the maximum output sine frequency.

In one embodiment, the adder-accumulator 530 employs the carry circuit having the single-level parallel gated design as detailed herein. In a further embodiment, the invention comprises the carry circuit having the single-level parallel gated design and the sum circuit employing two separate XOR gates as described herein.

The phase accumulator 520 is coupled to the Phase to Amplitude Converter 535 that essentially takes the phase information and converts the phase information into the values of a sine wave by addressing the sine Read Only Memory (ROM) in the Converter 535. The ROM stores the values of the sine wave. As part of the design, the number of bits must match the number of address lines on the ROM of the Converter 535 and it cannot use all the bits in the accumulator. The Converter 535 output is presented to the digital to analog converter (DAC) 540 which develops a quantized analog sine wave. The DAC 540 determines the harmonic noise (uncertainty), wherein an 8 bit DAC has a −48 dB signal to noise ratio (SNR) while a 12 bit DAC has a −72 dB SNR. The size of the DAC is also used in selecting the size of the ROM of the Converter 535. The DAC 540 generally is high speed, voltage output and has a low output impedance.

There is often a filter section 545 that removes high frequency sampling components and provides a pure sine wave output to an amplifier unit 550 that generates the output sine wave 560. Typically, a low pass filter (LPF) is used such as a passive LC configuration.

The output from the filter 545 may be amplified and results in the sine output 560. As known in the art, at DDS frequencies close to one half the clock frequency, the data becomes more difficult to filter. Therefore, in practice, the DDS operation is usually limited to approximately 40% of the clock frequency.

High-speed accumulators are frequently used as a benchmark to demonstrate the intrinsic speed and the ability to yield moderately high device count circuits in InP double heterojunction bipolar transistor (DHBT) technology. The high speed accumulator is of particular interest as a building block for the direct digital synthesizers (DDS) as is disclosed in A. Gutierrez-Aitken, J. Matsui, E. N. Kaneshiro, B. K. Oyama, D. Sawdai, A. K. Oki, and D. C. Streit, "Ultrahigh-speed direct digital synthesizer using InP DHBT technology," *IEEE J. Solid-State Circuits*, vol. 37, no. 2, pp. 1115-1119, September 2002. As noted, the frequency range and resolution is largely determined by the accumulator clock frequency and data word width. In order to achieve both a high clock frequency and a wide data word width, a combination of modular design and pipelining can be employed in an advanced III-V process. Certain combinational techniques are described in C. G. Eckroot and S. I. Long, "A GaAs 4-bit adder-accumulator circuit for direct digital synthesis," *IEEE J. Solid-State Circuits*, vol. 23, no. 2, pp. 573-580, April 1988.

While not limited to DDS, the high-speed accumulator circuits are an important component of the direct digital synthesizers. To allow direct generation of these waveforms at radio frequencies up to X-band, the accumulator circuit must operate at clock rates ≧30 GHz, thus they benefit from the inherent high-speed of InP DHBT devices. The accumulator must also have a wide bit width in order to provide adequate frequency resolution, thus requiring transistor counts approaching 5000 devices.

The adder-accumulator is modular and pipelined, allowing for expansion to wider data words, while preserving high clock frequency operation. The adder-accumulator also employs a single-level parallel-gated carry circuit. This allows for operation at high clock frequencies while taking a step towards reduced power consumption. In one embodiment, the present invention allows for inherent speed and yield of the InP DHBT process by demonstrating an accumulator circuit operating at a 41 GHz clock frequency with over 600 transistors. By modifying the sum circuit and reducing the power supply from the previous design, it was possible to simulate a reduction in the core power consumption of over 16% while maintaining high frequency operation at 40 GHz. While this embodiment was designed near peak $f_t$ for maximum speed performance, further reductions in power can be made by reducing the supply voltage to 3.6V and decreasing the current density at the expense of a lower clock frequency of 30 GHz.

One embodiment used InP DHBT technology with $f_t$ and $f_{max}$ both over 300 GHz. This technology is generally described by G. He, J. Howard, M. Le, P. Partyka, B. Li, G. Kim, R. Hess, R. Bryie, R. Lee, S. Rustomji, J. Pepper, M. Kail, M. Helix, R. Elder, D. Jansen, N. E. Harff, J. Prairie, and E. S. Daniel, "Self-aligned InP DHBT with $f_t$ and $f_{max}$ both over 300 GHz in a new manufacturable technology," *IEEE Electron Device Letters*, 2004, submitted for publication. However the present invention is not restricted or limited to this particular technology.

Thus, one embodiment of the present invention realized a 4-bit adder-accumulator test circuit in InP DHBT technology with a maximum clock frequency of 41 GHz.

One embodiment of the accumulator of the present invention is an InP 4-bit accumulator operating at 41 GHz clock frequency accumulator with a power consumption of 4.1 W such as is disclosed in S. E. Turner, D. S. Jansen, and D. E. Kotecki, "4-bit adder-accumulator at 41 GHz clock frequency in InP DHBT technology," *IEEE Microwave and Wireless Components Letters*, S. Turner, R. Elder, D. Jansen, and D. Kotecki, "4-Bit Adder-Accumulator at 41-GHz Clock Frequency in InP DHBT Technology," *IEEE Microwave and Wireless Components Letters*, Vol. 15, No. 3, pp. 144-146, March 2005, the contents of which are incorporated herein by reference. This particular design used a multi-level circuit topology requiring a 5.5V supply voltage for some sub-circuits, which leads to the relatively high power dissipation. One aspect includes fabricating the transistors using processes such as Vitesse VIP-2.

Another embodiment of the present invention provides circuit that allows the overall power supply voltage to be reduced by a diode drop, while maintaining high clock frequency operation. Simulations of a 4-bit accumulator with this circuit show operation at about 40 GHz clock frequency with a power consumption of 3.4 W. In both instances, the circuits are designed for maximum speed and operate near peak $f_t$. This application discloses the architecture of the accumulator, the design of the previously reported circuit, and the modifications contained in the new benchmarks.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A circuit for arithmetic processing, comprising:
   a carry/majority circuit comprising
      a plurality of differential transistor pairs coupled in parallel with each pair coupled on a first output end of said differential transistor pairs forming a respective leg and a second output end of said differential transistor pairs forming a pair of output nodes, wherein said differential transistor pairs have a single parallel gated level; and
      a pair of resistors coupled in parallel with a first end coupled to said differential transistor pairs at said respective output nodes; and
   a buffer circuit coupled to said output nodes to provide a full differential between said output nodes regardless of inputs to said differential transistor pairs, wherein said buffer circuit is coupled to a clock;
   wherein current is steered through said leg of said differential transistor pairs having a higher input voltage.

2. The circuit according to claim 1, wherein a second end of said resistors are coupled to a ground and each said leg is coupled to a negative voltage supply.

3. The circuit according to claim 1, wherein a second end of said resistors are coupled to a positive voltage supply and each said leg is coupled to a ground.

4. The circuit according to claim 1, wherein each transistor of said differential transistor pairs is selected from the group consisting of: bipolar transistors, field effect transistors, metal oxide semiconductor field effect transistors, and insulated gate bipolar transistors.

5. The circuit according to claim 1, wherein said pair of resistors are matched.

6. The circuit according to claim 1, wherein a full differential between said output nodes occurs when all inputs or no inputs of said differential transistor pairs are a logic high.

7. The circuit according to claim 1, wherein a voltage level of said output nodes is calculated as the sum of said current multiplied by a resistance value of said resistor.

* * * * *